United States Patent
Sharps et al.

(10) Patent No.: US 6,680,432 B2
(45) Date of Patent: Jan. 20, 2004

(54) APPARATUS AND METHOD FOR OPTIMIZING THE EFFICIENCY OF A BYPASS DIODE IN MULTIJUNCTION SOLAR CELLS

(75) Inventors: Paul R. Sharps, Albuquerque, NM (US); Marvin Brad Clevenger, Albuquerque, NM (US); Mark A. Stan, Albuquerque, NM (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 09/999,598

(22) Filed: Oct. 24, 2001

(65) Prior Publication Data
US 2003/0075215 A1 Apr. 24, 2003

(51) Int. Cl.⁷ .......................... H01L 31/06; H01L 31/04
(52) U.S. Cl. ...................... 136/255; 136/249; 136/262; 136/252; 136/293; 257/449; 257/453; 257/464; 257/431
(58) Field of Search ................................. 136/255, 249, 136/262, 252, 293; 257/449, 453, 464, 431

(56) References Cited

U.S. PATENT DOCUMENTS

| | | | |
|---|---|---|---|
| 4,598,164 A | * | 7/1986 | Tiedje et al. ............... 136/249 |
| 4,759,803 A | | 7/1988 | Cohen |
| 5,009,720 A | | 4/1991 | Hokuyo et al. |
| 5,138,403 A | | 8/1992 | Spitzer |
| 6,103,970 A | | 8/2000 | Kilmer et al. |
| 6,278,054 B1 | * | 8/2001 | Ho et al. ..................... 136/256 |
| 6,300,558 B1 | * | 10/2001 | Takamoto et al. .......... 136/262 |
| 6,316,716 B1 | * | 11/2001 | Hilgrath ..................... 136/255 |
| 6,359,210 B2 | | 3/2002 | Ho et al. |
| 2002/0040727 A1 | * | 4/2002 | Stan et al. .................. 136/255 |
| 2002/0164834 A1 | * | 11/2002 | Boutros et al. .............. 438/59 |

FOREIGN PATENT DOCUMENTS

| | | | |
|---|---|---|---|
| EP | 1056137 A1 | * | 11/2000 |
| GB | 2346010 A | * | 7/2000 |
| JP | 9-64397 A | * | 3/1997 |

* cited by examiner

Primary Examiner—Alan Diamond
(74) Attorney, Agent, or Firm—White & Case LLP

(57) ABSTRACT

Apparatus and Method for Optimizing the Efficiency of a Bypass Diode in Solar Cells. In a preferred embodiment, a layer of TiAu is placed in an etch in a solar cell with a contact at a doped layer of GaAs. Electric current is conducted through a diode and away from the main cell by passing through the contact point at the GaAs and traversing a lateral conduction layer. These means of activating, or "turning on" the diode, and passing the current through the circuit results in greater efficiencies than in prior art devices. The diode is created during the manufacture of the other layers of the cell and does not require additional manufacturing.

35 Claims, 5 Drawing Sheets

APPARATUS AND METHOD FOR OPTIMIZING THE EFFICIENCY OF A BYPASS DIODE IN MULTIJUNCTION SOLAR CELLS

FIELD OF THE INVENTION

The present invention relates to solar cells and methods for their fabrication, and more particularly to optimizing the efficiency of a bypass diode within solar cells.

DESCRIPTION OF THE RELATED ART

Photovoltaic cells, also called solar cells, are one of the most important new energy sources that have become available in the past several years. Considerable effort has gone into solar cell development. As a result, solar cells are currently being used in a number of commercial and consumer-oriented applications. While significant progress has been made in this area, the requirement for solar cells to meet the needs of more sophisticated applications has not kept pace with demand. Applications such as satellites used in mobile and telephone communications have dramatically increased the demand for solar cells with improved power and energy conversion characteristics.

In satellite and other space related applications, the size, mass, and cost of a satellite power system is dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Solar cells are often used in arrays, an assembly of solar cells connected together in a series. The shape and structure of an array, as well as the number of cells it contains, are determined in part by the desired output voltage and current.

When all of the solar cells in an array are receiving sunlight or are illuminated, each cell will be forward biased. However, if any of the cells are not illuminated, because of shadowing or damage, those cells may become reversed biased in order to carry the current generated by the illuminated cells. This reverse biasing can degrade the cells and can ultimately render the cells inoperable. In order to prevent reverse biasing, a diode structure is often implemented.

The purpose of the bypass diode is to draw the current away from the shadowed or damaged cell. The current flows through the bypass diode and it becomes forward biased when the shadowed cell becomes reverse biased. Rather than forcing current through the shadowed cell, the diode draws the current away from the shadowed cell and maintains the connection to the next cell.

Different types of bypass diodes have been utilized in prior art. In some configurations the bypass diode is connected to the exterior of a solar cell array. This is a difficult device to manufacture, and charges the array assembler with a task perhaps better performed by the cell manufacturer. Another conventional method to provide bypass diode protection to a solar cell array has been to connect a bypass diode between adjacent cells, with the anode of the bypass diode connected to one cell and the cathode of the diode connected to an adjoining cell. However, this technique is complicated to manufacture and requires a very difficult and inefficient assembly method. Another technique for providing a bypass diode for each cell involves a recess formed onto the back of each cell and a bypassed diode being placed into this recess. This technique has not yet proven efficient to manufacture because of the delicacy of the cells and because the technique requires the connection of the adjoining cells to be formed by the assembler of the array as opposed to the cell manufacturer.

Given the foregoing, there is a necessity for an integral bypass diode which can be manufactured by the cell manufacturer as an integral part of the cell itself, taking the responsibility for the bypass away from the array assembler. Rather than working with an array assembler to develop the most efficient means of including a bypass diode as part of the array, the device demonstrated by this invention allows the cell manufacturers to simply give the array assemblers an all-in-one cell that can be tightly packed and arrayed without the necessity of adding an additional bypass diode device to the array.

U.S. Pat. No. 6,278,054 (the "'054 patent") describes an integral bypass diode that attempts to address these drawbacks. However, the '054 patent requires additional epitaxial layers to be grown on top of the multijunction cell structure, and the bypass diode described in the '054 patent is for a homojunction made out of GaAs. Most of this additional epitaxial layer has to be etched off the front of the cell, leaving only a small area to be used as the bypass diode.

European Patent no. 1 056 137 A1, Application Serial No. 00109681.7 discloses a Schottky diode for a two junction or single junction device, in contrast to the device described herein.

SUMMARY OF THE INVENTION

A preferred embodiment of the present invention provides a method for manufacturing a bypass diode in a multijunction solar cell with at least three junctions.

In accordance with the purpose of the invention, as embodied and broadly described herein, the invention relates to an alternative and more effective way of optimizing the efficiency of and manufacturing a bypass diode so as to create a monolithic integral bypass diode that can be manufactured with a high rate of efficiency and when operable will require less voltage than prior art devices.

Advantages of the invention will be set forth, in part, in the description that follows and, in part, will be understood by those skilled in the art from the description herein.

BRIEF DESCRIPTION OF THE DRAWINGS

The accompanying drawings, which are incorporated in and constitute a part of this specification, illustrate an embodiment of the invention and, together with the description, serve to explain the principles of the invention.

DETAILED DESCRIPTION OF A PREFERRED EMBODIMENT

The following describes the present invention more fully with reference to the accompanying drawings, in which a preferred embodiment of the invention is shown. The present invention may, however, be embodied in many different forms and should not be construed as being limited to the embodiment set forth herein; this embodiment is provided so that this disclosure will be thorough and complete and will fully convey the invention to those skilled in the art.

The present invention relates to a multijunction solar cell with at least one integral monolithic bypass diode. The layers comprising the solar cell are particularly chosen for their combination of efficiency and manufacturability. As discussed below, one embodiment consists of a multijunction structure with at least three junctions, with a unique modified buffer structure.

The process of manufacturing the solar cell with an integral monolithic bypass diode is comprised of five distinct steps, which are described below.

Figure 1:
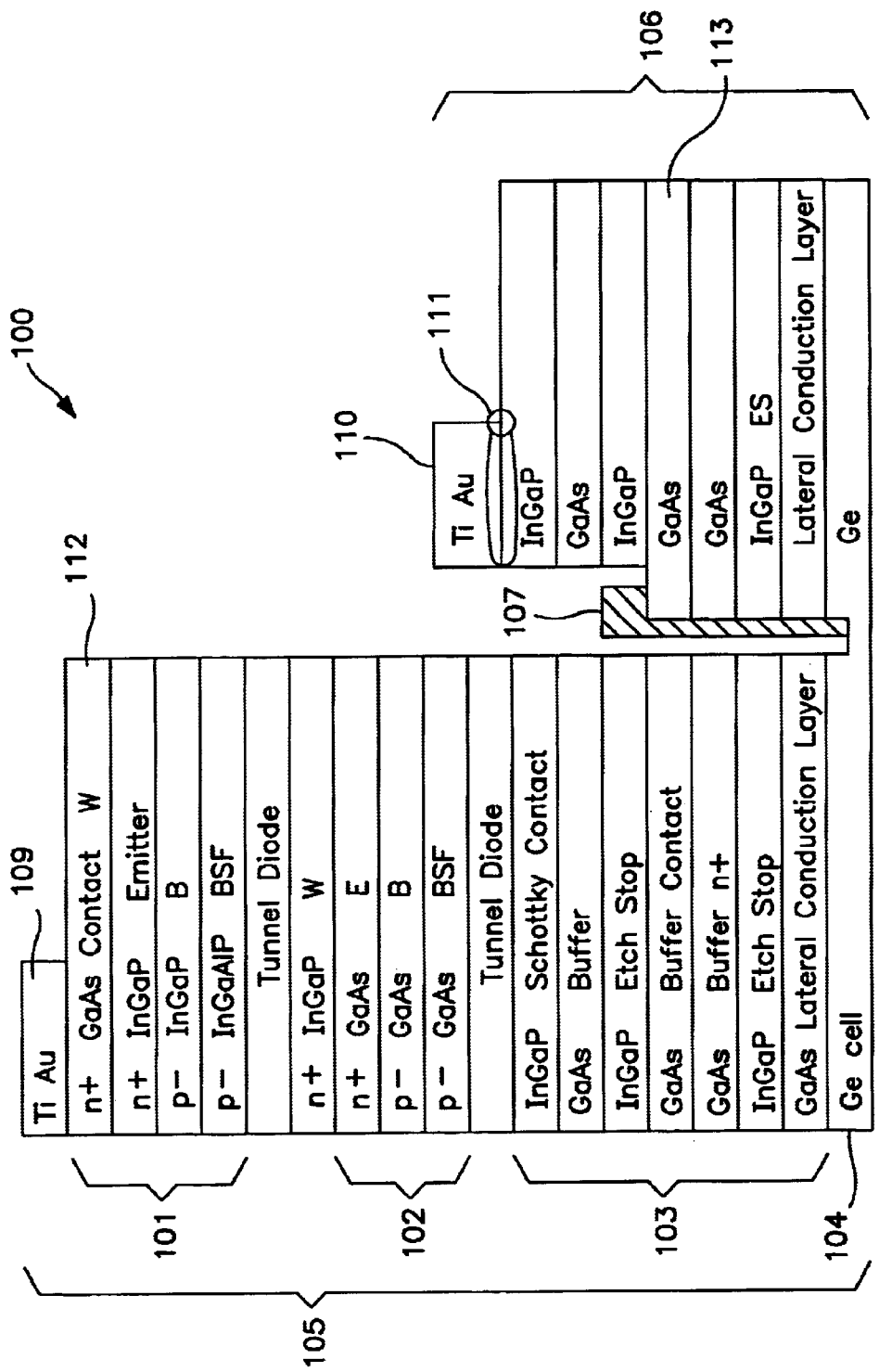
FIG. 1 illustrates one embodiment of the present invention, a multijunction solar cell, after the completion of all processing steps, illustrating the composition of such embodiment.

FIG. 1 is an illustration of an embodiment of the invention, a monolithic solar cell with an integral bypass diode. FIG. 2 is a series of schematic drawings of the two possible current paths through the cell.

Figure 2C:
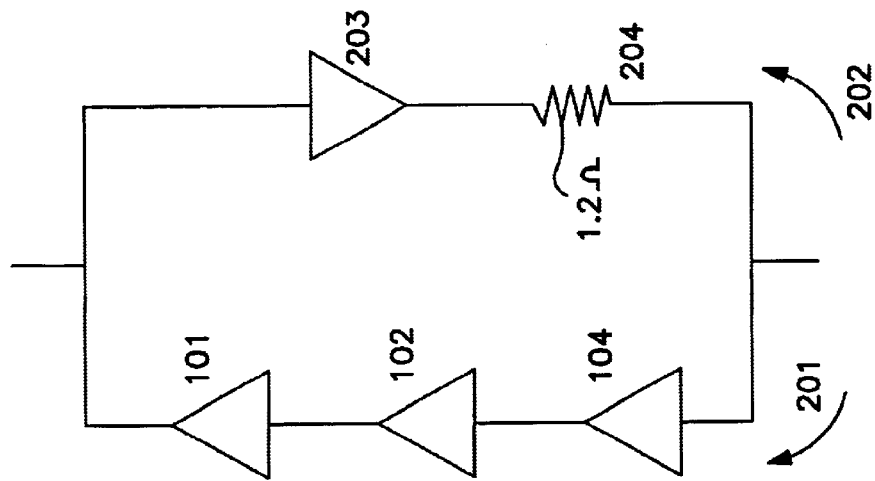
FIG. 2 illustrates the two paths current in the cell illustrated in FIG. 1 can take, given a particular set of circumstances.
Figure 2B:
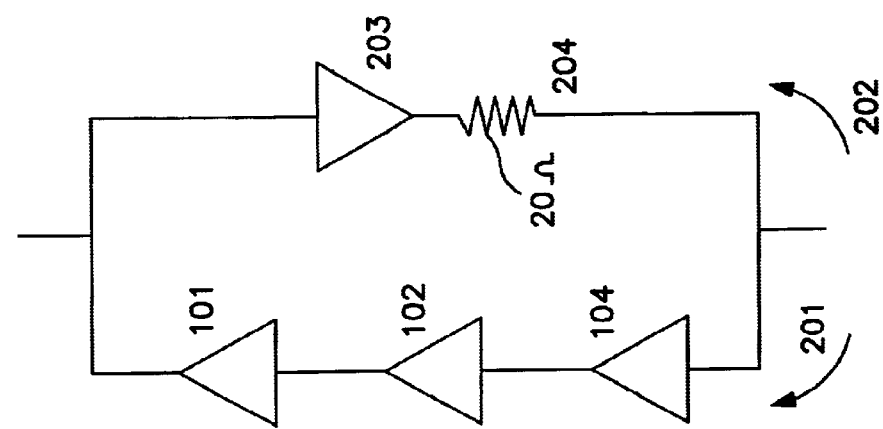
Figure 2A:
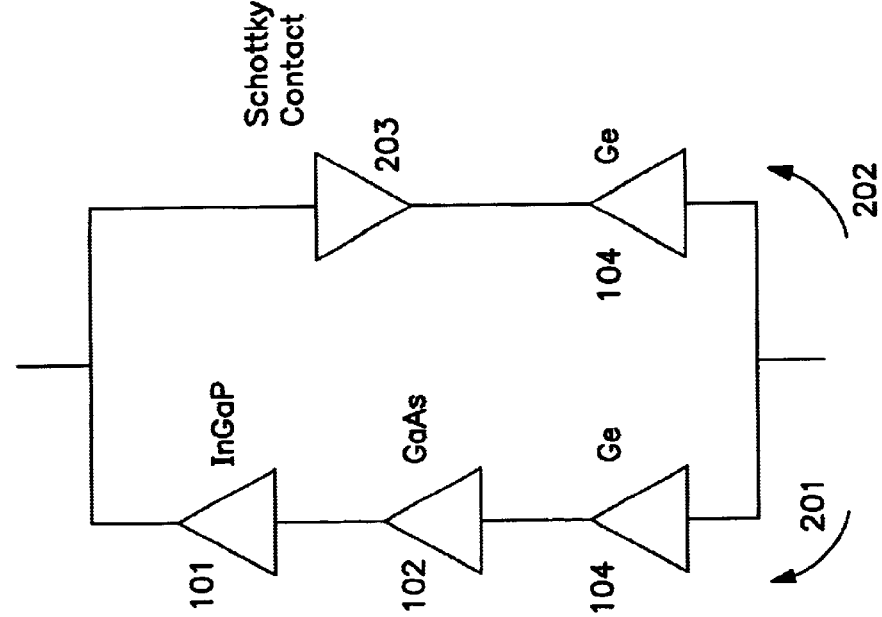
Figure 4:
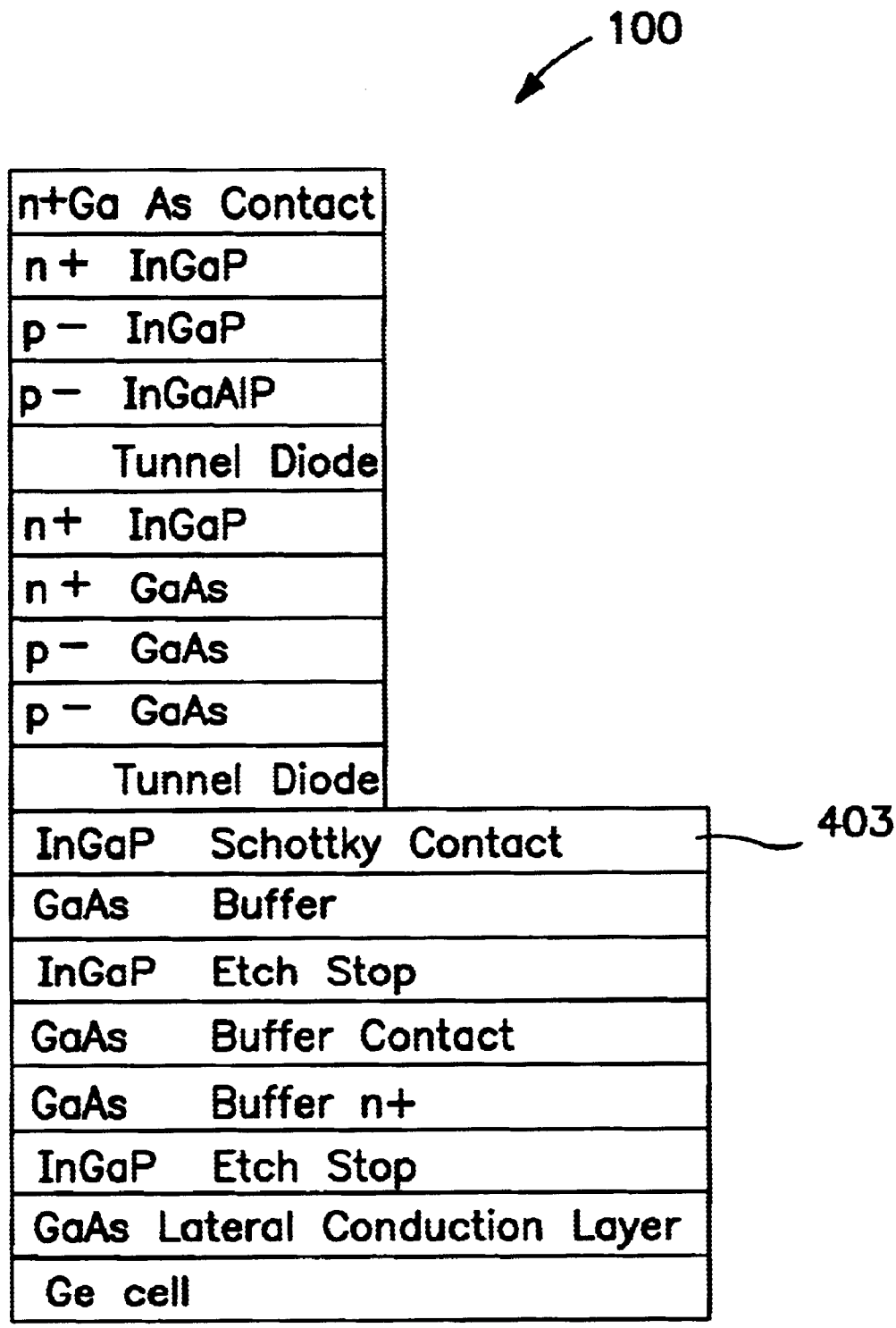
FIG. 4 illustrates a first processing step used to construct one embodiment of the present invention.

FIG. 1 shows a multijunction solar cell 100 with a cell of Indium Gallium Phosphorus (InGaP) 101 and a cell of Gallium Arsenide (GaAs) 102 over a GaAs buffer 103 on top of a Germanium (Ge) substrate 104. When the solar cell 100 is illuminated, both a voltage and a current are generated. FIG. 2A represents the solar cell as seen in FIG. 4, without the metalization 107 and lateral conduction layer 113 described below. If the solar cell is illuminated, there will be no barrier to the current following the cell path 201 through the layers of the solar cell: the Ge junction 104, the GaAs junction 102, and the InGaP junction 101.

However, when the solar cell 100 is not receiving sunlight, whether because of shading by a movement of the satellite, or as a result of damage to the cell, then resistance exists along the cell path 201. As solar cells exist in an array, current from illuminated cells must pass through shaded cells. If there were no diode, the current would force its way through the cell path 201, reversing the bias of such cells and degrading, if not destroying them.

If the cell contains a diode, however, the current can be offered an alternate, parallel path 202, and the shaded cells will be preserved. The problem with this concept has been the difficulty in creating a diode that is relatively easy to manufacture and which uses a very low level of voltage to turn on and operate. The invention described herein solves these problems.

If a cell is shaded or otherwise not receiving sunlight, in order for the current to choose the diode path 202, the turn on voltage for the diode path 202 must be less than the breakdown voltage along the cell path 201. The breakdown voltage along the cell path will typically be at least five volts, if not more. The Schottky contact 111 requires a relatively small amount of voltage to "turn on"–600 milivolts. However, to pass through the Ge junction 104, the bias of the Ge junction 104 must be reversed, requiring a large voltage. Reversing the bias of the Ge junction 104 requires approximately 9.4 volts, so nearly ten volts are needed for the current to follow the diode path 202 in FIG. 2A. Ten volts used to reverse the bias of the Ge junction is ten volts less than otherwise would be available for other applications. The device illustrated by FIG. 4 is therefore a functioning bypass diode, but an inefficient one from a power utilization perspective.

To address this inefficiency, in the metalization process in which the Titanium Gold (TiAu) contacts 109, 110 are added to the solar cell, an additional layer of metal 107 is added as well. In the embodiment shown in FIG. 1, the metal is TiAu, although practitioners in the art will be well aware that other metals can also be used.

The effect of the metal 107 is to "short" the Ge junction 104 to the base of the Ge cell 104. Because of the short, a minimal voltage is required to pass current between the layer 113 and the Ge substrate. No longer is a high voltage required to force the current through the Ge junction 104. The current flows easily through the "short path" 107. FIG. 2B provides a schematic representation. If the solar cell is shaded, no longer is the cell forced into reverse bias to pass the current of the array string. There is a much less resistive path, requiring a much lower voltage drop, for the current to pass through the bypass diode 203. With the addition of the metalization 107, the Ge cell 104 is shorted. As a result, rather than a reverse biased diode with a 9.4 turn-on voltage, the current instead encounters an ohmic resistance path represented by the resistor 204.

The layer is doped to about 7 to 8 times $10^{17}$ cm$^3$ to do two things. First, it reduces the contact resistance of the metal layer 107 and second, it provides a low resistance path for the lateral conduction layer. Without the lateral conduction layer, the resistance at the resistor 204 is approximately 20 ohms. 20 ohms represents a significant drain on the current of the solar cell. To reduce this resistance, a lateral conduction layer 113 is added to the solar cell. FIG. 2C represents the current paths in the solar cell as depicted in FIG. 1. When the solar cell is shaded, the current will flow to the resistor 204. Because of the presence of the lateral conduction layer 113, the resistance at the resistor can be as low as 0.4 ohms.

Figure 3:
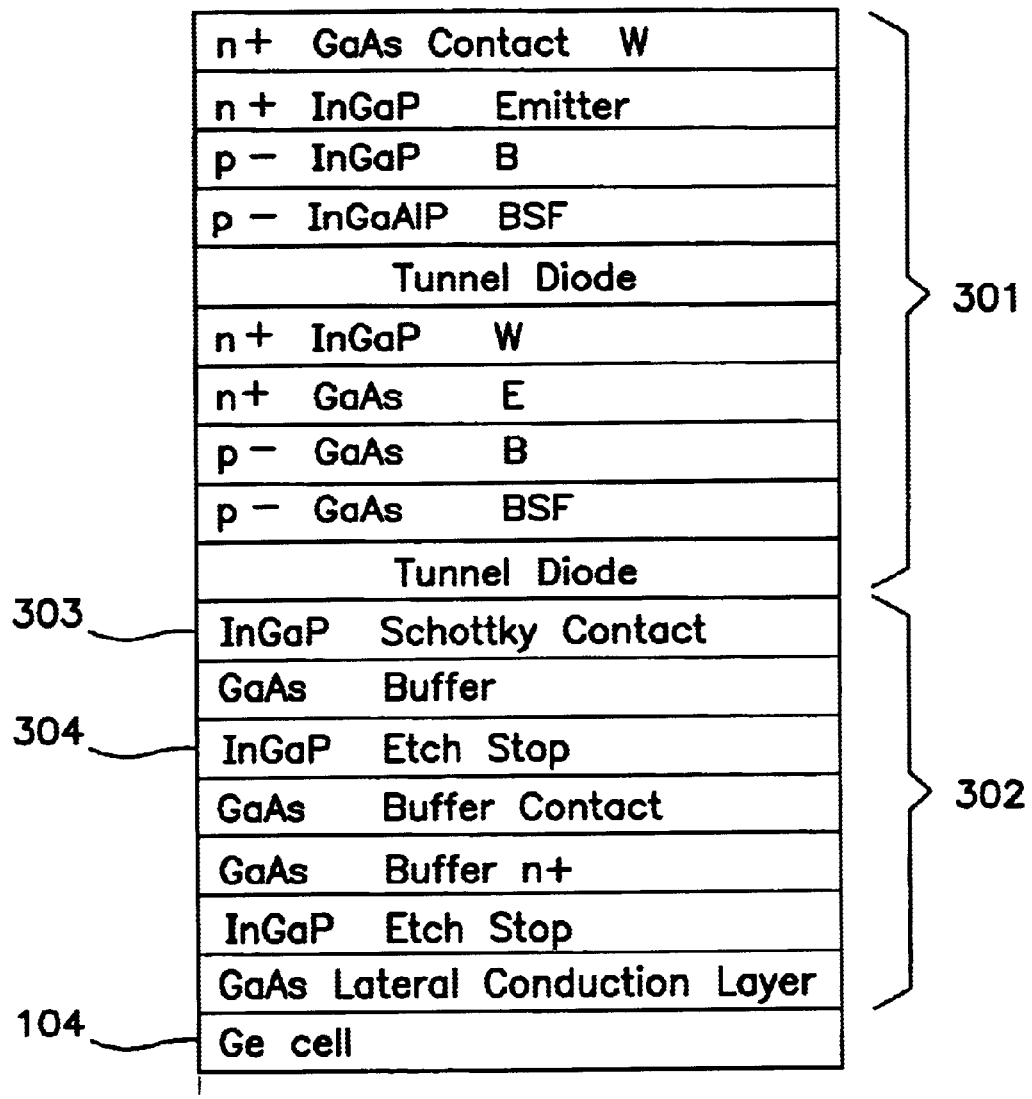
FIG. 3 illustrates one embodiment of the present invention, a multijunction solar cell, prior to any processing steps.

The manufacturing process for the solar cell 100 comprises five steps. FIG. 3 shows a multijunction solar cell 100 and the component parts: the multijunction structure 301 and the buffer structure 302. In the illustrated embodiment, a top cell comprised of an n-on-p InGaP$_2$ 101 is grown over a cell of n-on-p GaAs 102. A third diffused Ge junction 104 is formed due to diffusion of As during the growth of buffer layers 103.

A buffer exists between the upper junctions in the solar cell and the Ge substrate 104, because the upper junctions are fabricated of III–V material, and the entire cell is grown on a Ge substrate 104. Ge is a group IV element, so it has different lattice parameters than group III–V elements. Lattice matching is generally accepted among those skilled in the art as a way to increase the efficiency of a solar cell, and it follows that lattice mismatching decreases a cell's overall efficiency. To achieve lattice matching, the buffer layer is inserted in the manufacture process; normally it is a thick layer of GaAs grown over the Ge substrate. An InGaP layer lattice matches with a GaAs layer much better than with a Ge layer.

The buffer structure 302 is comprised of the following: an InGaP Schottky contact 303 as the top layer of the buffer structure 302. This will later form the Schottky diode. The buffer structure 302 is also comprised of an additional etch stop 304. The etch stop 304 enables the device to be more easily manufactured. Upon "wet etching" the etch stop creates barriers during processing which facilitate formation of the bypass diode. The lateral conduction layer 113 exists in this buffer layer, to more efficiently guide the current out of the diode, as discussed above.

As shown on FIG. 4, the first step in the manufacturing process is to make a "wet etch" that comes down into the cell 100 and terminates at the InGaP layer 403.

A TiAu contact 110 is formed upon the InGaP layer 403. A TiAu contact 109 is formed at the top of the cell to make an ohmic contact with the n+-GaAs layer 112. The TiAu contact 110 on the InGaP layer 403 makes a Schottky contact, which is non-ohmic. In other words, instead of looking like a resistor, such contact 403 and the TiAu contact 110 forms a diode.

Figure 5:
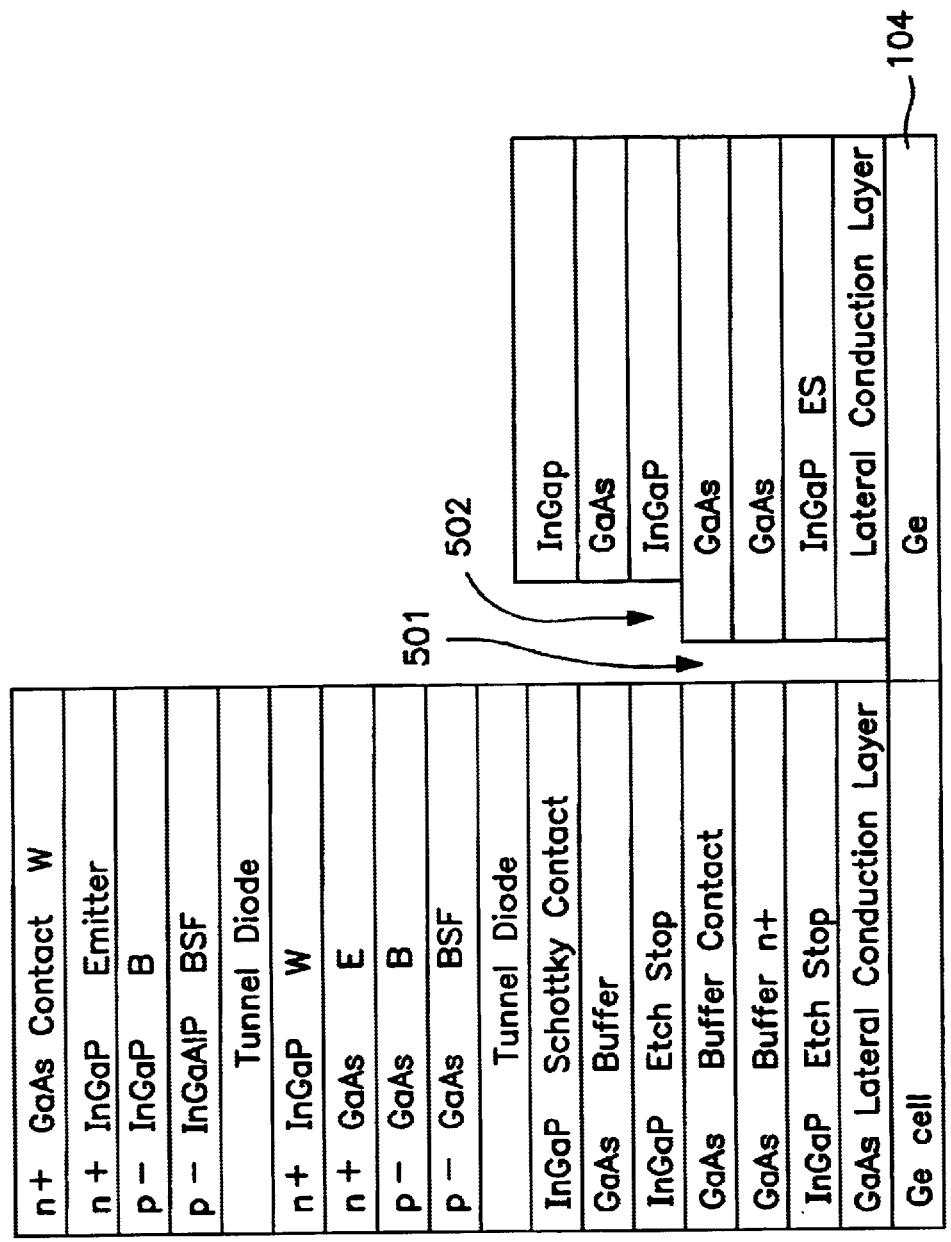
FIG. 5 illustrates the second and third processing steps used to construct one embodiment of the present invention.

The second step in the manufacturing process is demonstrated in FIG. 5. FIG. 5 shows a "mesa etch" 501 down to the level of the Ge cell 104. The primary purpose of this step is to create a true diode 106, electrically isolating the junctions 105 within the solar cell from the diode 106. When the entire solar cell is manufactured and the metal contacts are bound and the cell is packaged, the cell 105 and the diode 106 will be parallel, yet electrically separate.

The third step is a "shunt etch" 502, which provides a "shelf" on which the metal 107 in the next step will be laid. To make etches in the middle of manufacturing without etch stops among the layers, one would have to use a "minute etch" which would be extremely difficult to use with any degree of precision in this instance. The etch stop 304 allows the solar cell to be manufactured more efficiently.

The fourth step is the metalization process. The TiAu contacts 109, 110 are added, and the metal layer 107 is added. In this embodiment the metal comprising the layer is TiAu. Where the TiAu contact 110 meets the InGaP layer 403, a Schottky contact is created.

At the TiAu contact 109 on top of the cell, the TiAu makes an ohmic contact to n-type GaAs 112. That is an ordinary cell conduction for this type of cell to persons skilled in the art. With the TiAu contact 110 at the InGaP layer 403, a Schottky contact is created. However, because the object is to "short out" the Ge cell 104, the contact was made to the highly doped n+-GaAs cell 113. Layer 113 is also a lateral conduction layer. Upon making the contact to the GaAs layer 113, a resistor is created. The resistance at the resistor 204 was approximately 20 ohms, as illustrated in FIG. 2A. 20 ohms of power dissipation can make the cell too inefficient from a power utilization perspective.

The etch stop at the GaAs buffer contact 304 alleviates this problem. The GaAs buffer contact 113 is n+ doped at the same level as the GaAs buffer contact 112 at the top of the cell. This creates a cell with the same quality of contact between the TiAu contact 109 and the GaAs contact layer 112 at the top of the cell as the metal contact 107 with the GaAs layer 113.

Modifying the thicknesses of the various layers in the diode 106 is another way to decrease resistance in the diode 106.

The lateral conduction layer 113 also alleviates the resistance through the diode 106, from 20 ohms to as low as 0.4 ohms. The current path passes through the diode 106, and the thickness of the diode would ordinarily cause some resistance, but the lateral conduction layer 113 helps the current move to the metal more efficiently. In this embodiment, the lateral conduction layer is made of highly doped n+-GaAs. The shunt layer 107 can also be made to partially or completely surround the contact 110, further lowering the series resistance.

The lateral conduction layer 113 and the metalization 107 are the two most important means to lessen the amount of voltage needed to "turn on" the diode and bypass the shaded cell. By reducing the series resistance, the amount of localized $I^2R$ heating is also reduced. The process is also unique becaues the amount of processing steps are reduced (compared to the '054 patent), as the bypass diode layers are grown internally to the buffer layers of the cell, rather than as additional layers that have to be grown on top of the cell (as in the '054 Patent). The current device provides for a low bypass diode turn on, as well as a low series resistance bypass diode. Completion of the bypass diode circuit requires a soldered or welded interconnect made between contacts 109 and 110. This can be done as part of the usual interconnect weld.

The fifth step in the manufacturing process is to apply the anti-reflective coating and include etches where external contacts will be attached.

As can be seen from the foregoing, the process by which the diode is manufactured is integral to the manufacture of the cell, and does not require additional manufacturing steps or additional layers to be grown on the cell.

While we have described our preferred embodiments of the present invention, it is understood that those skilled in the art, both now and in the future, may make various improvements and enhancements which fall within the scope of the claims which follow. These claims should be construed to maintain the proper protection for the invention first disclosed.

What is claimed is:

1. A solar cell comprising:
    a multijunction solar cell structure including at least one or more epitaxially grown layers on a substrate, and having at least a first, second, and third photovoltaic subcell;
    the first photovoltaic subcell having a first photoactive junction monolithically grown above the substrate;
    the second photovoltaic subcell having a second photoactive junction monolithically grown above the first photovoltaic subcell;
    the third photovoltaic subcell having a third photoactive junction created through diffusion of epitaxially grown material into the substrate; and
    an epitaxially grown diode that is integral to at least a portion of the first photovoltaic subcell.

2. The solar cell as defined in claim 1, wherein the epitaxially grown diode is electrically connected across at least the first and second photovoltaic subcells to protect the first and second photovoltaic subcells against reverse biasing.

3. The solar cell as defined in claim 1, wherein the epitaxially grown diode has a Schottky contact.

4. The solar cell as defined in claim 1, wherein the substrate is a Ge substrate.

5. The solar cell as defined in claim 1, wherein the second photovoltaic subcell is fabricated at least in part of InGaP.

6. The solar cell as defined in claim 1, wherein the first photovoltaic subcell is fabricated at least in part of GaAs.

7. The solar cell as defined in claim 1, wherein the first photovoltaic subcell is fabricated at least in part of InGaAs.

8. The solar cell as defined in claim 1, wherein at least a portion of the third photovoltaic subcell is fabricated in a Ge substrate.

9. The solar cell as defined in claim 1, wherein the epitaxially grown diode is configured to operate in an AM 0 environment.

10. The solar cell as defined in claim 1, wherein the epitaxially grown diode is about 0.5 to 3.0 microns thick.

11. A solar cell comprising:
a multijunction solar cell structure including at least one or more epitaxially grown layers on a substrate and having at least a first, second, and third photovoltaic subcell;
the first photovoltaic subcell having a first photoactive junction monolithically grown above the substrate;
the second photovoltaic subcell having a second photoactive junction monolithically grown above the first photovoltaic subcell;
the third photovoltaic subcell having a third photoactive junction created by diffusion of epitaxially grown material into the substrate; and
an epitaxially grown diode having a Schottky contact that is integral to at least a portion of the first photovoltaic subcell.

12. The solar cell as defined in claim 11, wherein the epitaxially grown diode is electrically connected across at least the first and second photovoltaic subcells to protect the first and second photovoltaic subcells against reverse biasing.

13. The solar cell as defined in claim 11, wherein the substrate is a Ge substrate.

14. The solar cell as defined in claim 11, wherein the second photovoltaic subcell is fabricated at least in part of InGaP.

15. The solar cell as defined in claim 11, wherein the first photovoltaic subcell is fabricated at least in part of GaAs.

16. The solar cell as defined in claim 11, wherein the first photovoltaic subcell is fabricated at least in part of InGaAs.

17. The solar cell as defined in claim 11, wherein at least a portion of the third photovoltaic subcell is fabricated at least in part of Ge.

18. The solar cell as defined in claim 11, wherein the epitaxially grown diode is space qualified to operate in an AM 0 environment.

19. The solar cell as defined in claim 11, wherein the epitaxially grown diode is about 0.5 to 3.0 microns thick.

20. A solar cell comprising:
a multijunction solar cell structure including at least one or more epitaxially grown layers on a substrate and having at least a first, second, and third photovoltaic subcell;
the first photovoltaic subcell having a first photoactive junction monolithically grown above the substrate;
the second photovoltaic subcell having a second photoactive junction monolithically grown above the first subcell;
the third photovoltaic subcell having a third photoactive junction created by diffusion into the substrate; and
an epitaxially grown diode having a lateral conduction layer.

21. The solar cell as defined in claim 20, wherein the lateral conduction layer is comprised of highly doped $n^+$-GaAs.

22. The solar cell as defined in claim 20, wherein the lateral conduction layer is comprised of InGaAs.

23. The solar cell as defined in claim 20, wherein the substrate is a Ge substrate.

24. The solar cell as defined in claim 20, wherein the second subcell is fabricated at least in part of InGaP.

25. The solar cell as defined in claim 20, wherein the first subcell is fabricated at least in part of GaAs.

26. The solar cell as defined in claim 20, wherein the first subcell is fabricated at least in part of InGaAs.

27. The solar cell as defined in claim 20, wherein at least the third subcell is fabricated at least in part of Ge.

28. The solar cell as defined in claim 20, wherein the diode is space qualified to operate in an AM 0 environment.

29. The solar cell as defined in claim 20, wherein the diode is about 0.5 to 3.0 microns thick.

30. The solar cell defined in claim 20, wherein the lateral conduction layer is about 0.1 to 2.0 microns thick.

31. A monolithic diode integral to a multifunction solar cell comprising:
a substrate;
a lateral conduction layer deposited over the substrate;
a GaAs buffer layer deposited over the lateral conduction layer;
an InGaP contact layer deposited over the GaAs buffer layer; and
a Schottky contact formed between the InGaP contact layer and a contact.

32. The monolithic diode of claim 31, wherein the substrate is a germanium substrate.

33. The monolithic diode of claim 31, wherein the lateral conduction layer includes GaAs.

34. The monolithic diode of claim 31, further comprising a shunt layer configured to be coupled between the lateral conduction layer and the substrate.

35. The monolithic diode of claim 31, wherein the contact is TiAu contact.

* * * * *